United States Patent
Murahashi et al.

(10) Patent No.: US 6,583,976 B1
(45) Date of Patent: Jun. 24, 2003

(54) POWER SEMICONDUCTOR DEVICE

(75) Inventors: Akihiro Murahashi, Tokyo (JP); Takeshi Tanaka, Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 10/019,679

(22) PCT Filed: May 18, 2000

(86) PCT No.: PCT/JP00/03196

§ 371 (c)(1),
(2), (4) Date: Jan. 4, 2002

(87) PCT Pub. No.: WO01/89090

PCT Pub. Date: Nov. 22, 2001

(51) Int. Cl.$^7$ .................................................. H02H 3/00
(52) U.S. Cl. ....................................................... 361/100
(58) Field of Search .................................. 361/100, 101, 361/86, 87, 88, 89

(56) References Cited

U.S. PATENT DOCUMENTS 5,608,595 A   3/1997   Gourab et al.

FOREIGN PATENT DOCUMENTS

| JP | 7-221619 A | * | 8/1995 |
| JP | 8-191239 A | * | 7/1996 |
| JP | 8-213890 A | * | 8/1996 |
| JP | 10-14215 A | * | 1/1998 |
| JP | 10-42548 A | * | 2/1998 |
| JP | 2000-92820 | * | 3/2000 |

OTHER PUBLICATIONS

Kimata, M. et al., "High Performance Gate Drive Circuit of High Voltage IPMs(HVIPMs)", IEEE, 1998, p. 1196–1200.

* cited by examiner

*Primary Examiner*—Edward H. Tso
(74) *Attorney, Agent, or Firm*—Sughrue Mion, PLLC

(57) ABSTRACT

When first and second intelligent power module type semiconductor switching circuits configured by an IGBT respectively are connected in parallel, collectors of IGBT are connected to each other, and emitters of the IGBT are connected to each other. And, a resistor is connected to each of the emitters. Both of the resistors and have the same resistance value. Then, the emitters are connected to each other by an emitter auxiliary terminal connection line via this resistor and the auxiliary terminal. In addition, gates of the IGBT and the IGBT are connected to each other by a gate auxiliary terminal connection line via this resistor and a ferrite beads core that has a high impedance at a predetermined frequency.

6 Claims, 6 Drawing Sheets

POWER SEMICONDUCTOR DEVICE

TECHNICAL FIELD

The present invention relates to a power semiconductor device configured by a plurality of modules connected electrically in parallel, each module being configured by a power semiconductor switching element and a drive circuit for driving the switching element that are united into one.

BACKGROUND ART

Conventional semiconductor modules, when they do not incorporate none of a driving circuit and a protection circuit for a semiconductor switching element in them, are provided inevitably with a gate terminal, an emitter auxiliary terminal, etc. as disclosed in Japanese Patent Laid-Open No.59-100560, No.2-32560, No.10-14215, and No.10-173126. The gate terminal, the emitter auxiliary terminal, etc. are external terminals used to enter control signals and control voltages for driving, for example, transistors, IGBTs (Insulated Gate Bipolar Transistor), etc. required for configuring a semiconductor switching element.

On the other hand, an IPM (Intelligent Power Module) that incorporates a semiconductor switching element, a drive circuit for driving the switching element, and a protection circuit in itself enables an IGBT (Gate Drive Circuit) therein to receive a drive signal (input signal) via an input interface and a control logic as described, for example, in the technical trend of a high withstand voltage and large capacity power devices (Mitsubishi Denki Technical Report Vol.73, No.7, 1999, pp.7–11). The switching in the IPM is done by a drive voltage (gate voltage) applied to between the gate and the emitter of the IGBT from the gate drive circuit.

FIG. 5 shows a block diagram of a conventional IPM control protection circuit (Mitsubishi Denki Technical Report Vol.73, No.7, 1999, page 9).

As shown in FIG. 5, the conventional IPM is configured by a main circuit block that incorporates an IGBT in which a free wheel diode is connected between the collector and the emitter of an IGBT in the opposite direction, an output current control sensor is connected to the emitter, and a gate drive is connected to the base (gate), as well as a temperature sensor used to detect the ambient temperature of the IGBT in itself; a gate drive for controlling a gate signal output to the IGBT according to an IGBT output current control signal generated according to the current sensor detection signal and a current leading (di/dt) control signal; and a dedicated IC that incorporates a protection logic for controlling the gate signal so as to protect the IGBT according to the detection signal from the temperature sensor or power failure detector and a control logic for controlling the gate drive signal output to the gate drive according to an input signal entered from external via an input interface.

The IGBT of the IPM configured as described above, while the collector and the emitter are connected to external terminals of the module for connecting the main circuit therein, is not provided with any auxiliary terminal used for taking out the gate current and the emitter current directly. This is why no voltage can be applied directly to between the gate and the emitter of the IGBT.

This is because of the IPM function, which can omit both gate and emitter terminals otherwise to be used for driving and controlling the IGBT outside the module, since the IPM incorporates an IGBT drive circuit in itself.

Next, a description will be made for some problems to arise when a plurality of the conventional IPMs are connected in parallel for use.

When a plurality of IPMs are connected in parallel, common mode noise is eliminated by a common mode choke coil connected between ground lines of those IPMs and a drive signal is entered to each of the IPMs at the same time.

However, a difference occurs between the operation characteristics of those IPMs sometimes due to a time difference to occur between the IGBT drive circuits, a time difference to occur between turn-on and turn-off of each IGBT (hereinafter, to be referred to as a switching time), and a saturation voltage difference to occur between the collector and the emitter when the IGBT is on.

And, when a plurality of IPMs are connected in parallel, the total of an operation time difference between the drive circuits and an IGBT switching time difference between those IPMs causes a switching time difference between those IPMs.

Consequently, while a plurality of IPMs are connected in parallel, a difference between the turn-on times and a difference between turn-on voltages cause the current flowing in each of the IPMs connected in parallel to vary when in an IGBT on/off switching operation.

FIG. 6 shows a conventional method for connecting a plurality of semiconductor modules in parallel as disclosed, for example, in Japanese Patent Laid-Open No.10-14215. When the two IGBTs shown in FIG. 6 are different IGBT modules, a certain length is required for the gate connection line between the IGBT2A gate resistor 3A and the IGBT2B gate register 3B, thereby the line inductance becomes high.

Consequently, a resonance comes to occur in the resonance loop LP1 due to the gate-collector capacity of each of the gate connection line, the collector main circuit line CC, IGBT2A, and IGBT2B, as well as due to the gate-emitter capacity in each of the resonance loop LP2, the gate connection line, the emitter main circuit line EC, IGBT2A, and IGBT2B.

An IGBT module may be selected from those to be connected in parallel so that only the characteristics of the collector-emitter saturation voltage are adjusted in uniform between them. In the case of the conventional IPM parallel connection method as described above, it is required to adjust a plurality of such switching characteristics as the collector-emitter saturation voltage and the turn-on time or the turn-off time, etc. in uniform such so as to have a current flown in uniform in all the IPMs connected in parallel. This has been a problem for the parallel connection of IPMs as described above.

Furthermore, the conventional method has been confronted with another problem that a resonance occurs in the wiring loop of the gate auxiliary terminal connection line when the same voltage applies to between the gate and the emitter of the IGBT in each of the IPMs connected in parallel.

Under such circumstances, it is an object of the present invention to solve such the conventional problems and provide a power semiconductor device configured by a plurality of IPMs connected in parallel without selecting only the IPMs that are uniform in switching characteristics while such the selection has been required conventionally for parallel connection of IPMs.

DISCLOSURE OF THE INVENTION

In order to attain the above objects, the power semiconductor device of the present invention is formed as follows:

1. In the case when a first semiconductor switching circuit and a second semiconductor switching circuit which are configured by semiconductor switching elements respectively, are connected in parallel, first main electrodes at a main current input side are connected to each other and second main electrodes at the main current input side are connected to each other in each of the semiconductor switching elements, and one of a plurality of resistors having the same resistance value is connected to each of the second main electrodes and this resistor is connected to each of the second main electrodes by a first line conductor via an auxiliary terminal, and a control electrode of each of the semiconductor switching elements is connected by a second line conductor via an impedance element having a high impedance at a predetermined frequency.

2. Each semiconductor switching circuit of the present invention is an intelligent power module in which a semiconductor switching element, as well as a driver and a protection circuit of the switching element are united into one.

3. The first line conductor and the second line conductor are laid closely to each other.

4. The first line conductor and the second line conductor are configured by plate conductors disposed in parallel.

5. The first line conductor and the second line conductor are configured by twisted-pair lines formed by twisting a plurality of leads respectively.

6. The first line conductor and the second conductor are configured by shielded lines formed by sheathing a plurality of leads in a shielding member respectively.

BEST MODE FOR CARRYING OUT THE INVENTION

First Embodiment

Hereunder, the first embodiment of the present invention will be described with reference to the accompanying drawings.

Figure 1:
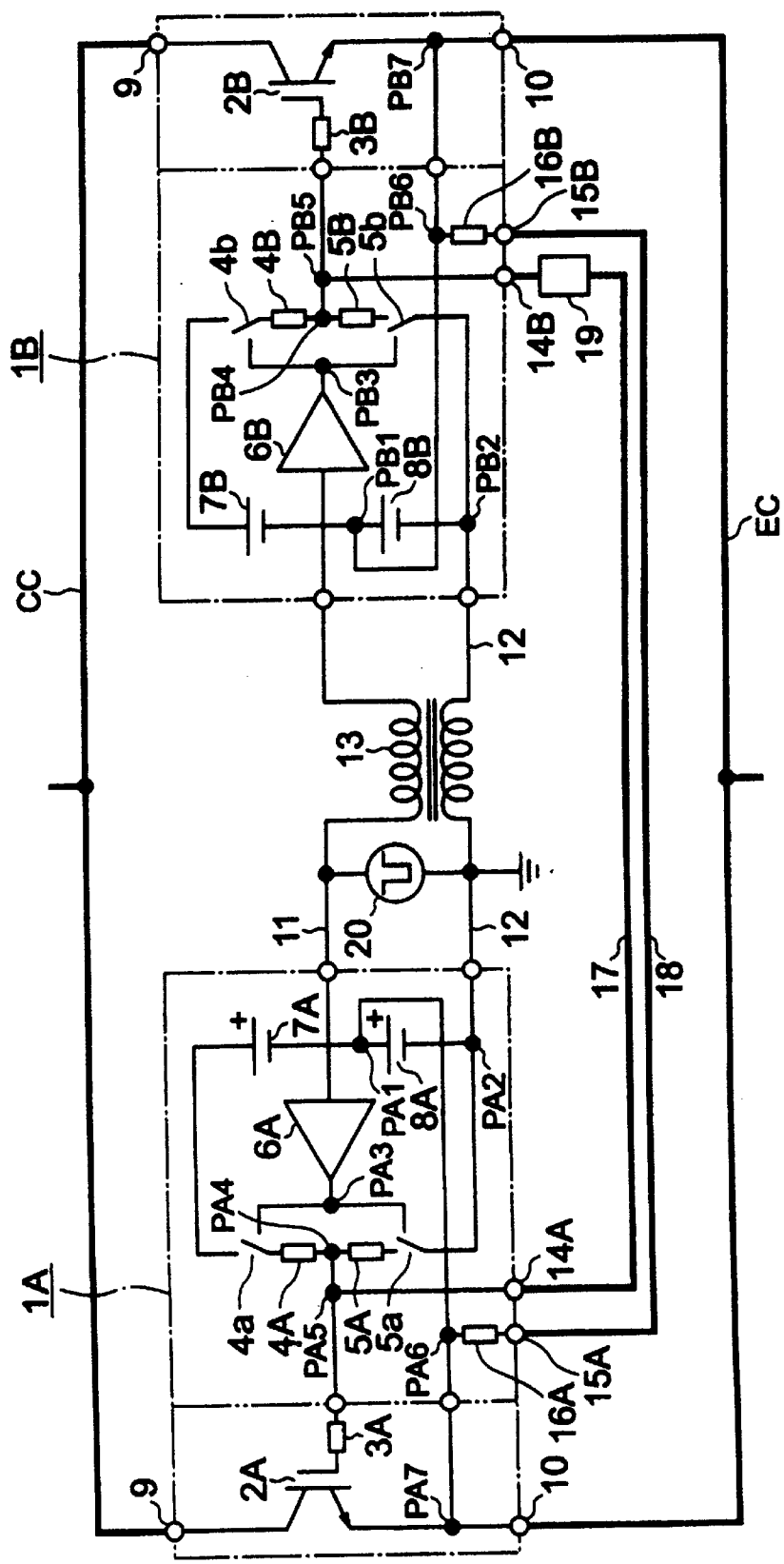
FIG. 1 is a block diagram of a power semiconductor device according to a first embodiment of the present invention.

FIG. 1 is a block diagram of a circuit configuration of a power semiconductor device in the first embodiment of the present invention. The power semiconductor device in this first embodiment, as shown in FIG. 1, is roughly divided into two modules; IPM1A and IPM1B. The two modules IPM1A and IPM1B are connected electrically in parallel via a circuit conductor (to be described later) on a substrate. Each of the IPM1A and the IPM1B includes, for example, a self-extinction switching element IGBT2, a drive circuit provided with a gate element 6 for issuing a gate signal used to turn on/off the IGBT2, etc., an IGBT protection circuit not shown, etc. that are all united into one.

A primary coil of a common mode choke coil 13 is also inserted between the ground line 12 of the IPM1A and the ground line 12 of the IPM1B. The primary coil eliminates the common mode noise transferred to the ground line 12 of the drive circuit on the substrate.

One end of a secondary coil of the common mode choke coil 13 is connected to an input terminal of the gate element 6A of the drive terminal and the other end of the secondary coil is connected to an input terminal of the gate element 6B of the drive circuit.

A drive control signal source 20 that enters a drive control signal 11 to each drive circuit is connected to between one ends of the primary coil and the secondary coil of the common mode choke coil 13. The drive control signal 11, when being entered to each drive circuit, becomes 0V (low level) or DC15V (high level).

Next, the configuration of the IPM1A/1B will be described.

Both IPM1A and IPM1B are identical to each other in configuration. In order to distinguish between IPM1A and IPM1B, A or a and B or b are just given to them.

The collectors of the IGBT2A and the IGBT2B in the IPM1A and the IPM1B are connected commonly to the plus collector side main circuit line CC. The emitters of them are connected commonly to the minus emitter side main circuit line EC.

Each of the IGBT2A and the IGBT2B receives an on-off drive signal via the gate resistor 3A/3B.

The gate element 6A of a drive circuit, at the time of receiving a +15V DC voltage from the drive control signal source 20 via its input terminal, outputs a +24V drive signal. At the time of receiving a +0V voltage, the gate element 6A outputs a 0V drive signal via the output terminal P3A. Consequently, the drain of the switching element 4a configured by, for example, an FET to be turned off by the 15V drive signal and to be turned on by the 0V drive signal is connected to the + terminal of the first power supply 7A and the drain of the switching element 5a configured by an FET to be turned on by the 15V drive signal and to be turned off by the 0V drive signal is connected to the − terminal of the second power supply 8.

The source of each switching element 4a/5a is connected to a junction point PA4 via a gate resistor 4A/5A. The junction point PA4 is connected to the gate of the IGBT2A via a gate resistor 3A of the IGBT2A.

The gate of each switching element 4a/5a receives an on/off drive signal from the output terminal PA3 of the gate element 6A.

The minus (−) terminal of the first power supply 7A and the plus (+) terminal of the second power supply 8A are connected to each other at a junction point PA1. The junction point PA1 is connected to a junction point PA7 via a circuit pattern in the emitter of the IGBT2A.

The same connections are also done in the IPM1B.

In each of the IPM1A and the IPM1B configured as described above, the collectors of the IGBT2A and the IGBT2B are connected commonly to the collector side main circuit line CC via the external terminals 9 and 9 and the emitters of the IGBT2A and the IGBT2B are connected commonly to the emitter side main circuit line EC via the external terminals 10 and 10, thereby the IGBT2A and the IGBT2B are connected to each other in parallel.

The circuit pattern that connects the junction point PA4 to the gate resistor 3A in the IPM1A and the circuit pattern that connects the junction point PB4 to the gate resistor 3B in the IPM1B are connected to the gate auxiliary terminals 14A and 14B used as external terminals of the IPM1A and the IPM1B via the junction points PA5 and PB5 in the above circuit patterns.

Furthermore, the circuit pattern that connects the junction point PA1 at the plus (+) terminal side of the second power supply 8A to the junction point PA7 at the emitter side of the IGBT2A in the IPM1A and the circuit pattern that connects the junction point PB1 at the plus (+) side of the second power supply 8B to the junction point PB7 at the emitter side of the IGBT2B in the IPM1B are connected to the emitter auxiliary terminals 15A and 15B used as external terminals of the IPM1A and the IPM1B via the resistors 16A and 16B.

The gate auxiliary terminal 14A is connected to a junction point PA5 at the current input side of the gate resistor 3A via a circuit pattern. The gate auxiliary terminal 14B connected to the current input side of the gate resistor 3B via a circuit pattern is connected to the gate auxiliary terminal connection line 17 via a ferrite beads core 19.

The emitter auxiliary terminals 15A and 15B are connected to each other via the emitter auxiliary terminal connection line 18. The connection line 18 and the gate auxiliary terminal connection line 17 make a pair.

The gate auxiliary terminal connection line 17 and the emitter auxiliary terminal connection line 18 are plate conductor lines, twisted pair lines, or shielded lines disposed closely to each other in parallel.

The gate resistors 4A and 4B are used only when the IGBT2A and the IGBT2B are turned on. The gate resistors 5A and 5B are used only when the IGBT2A and the IGBT2B are turned off.

Each of the DC power supplies 7A and 7B applies a positive voltage to between the gate and the emitter when the IGBT2A/2B is turned on. Each of the DC power supplies 8A and 8B applies a negative voltage to between the gate and the emitter when the IGBT2A/2B is turned on.

The gate auxiliary terminals 14A and 14B are connected to each other via the gate auxiliary terminal connection line 17 and the emitter auxiliary terminals 15A and 15B are connected to each other via the emitter auxiliary terminal connection line 18, thereby the gate potential and the emitter potential between the IGBT2A and the IGBT2B become equal.

Next, a description will be made for the operation of the power semiconductor device in the first embodiment with reference to the turn-off operation of each IGBT as an example. Because the IGBT2A/2B enables the emitter auxiliary terminals 15A and 15B to be connected to each other and the gate auxiliary terminals 14A and 14B to be connected to each other, both gate and emitter are kept at the same potential just before the IGBT is turned off.

When both of the IPM1A gate element 6A and the IPM1B gate element 6B receive a +15V drive signal 11 from the drive control signal source 20 at the same time according to a turn-off command, a +24V potential arises in both output terminals PA3 and PB3 of the gate elements 6A and 6B.

Figure 2:
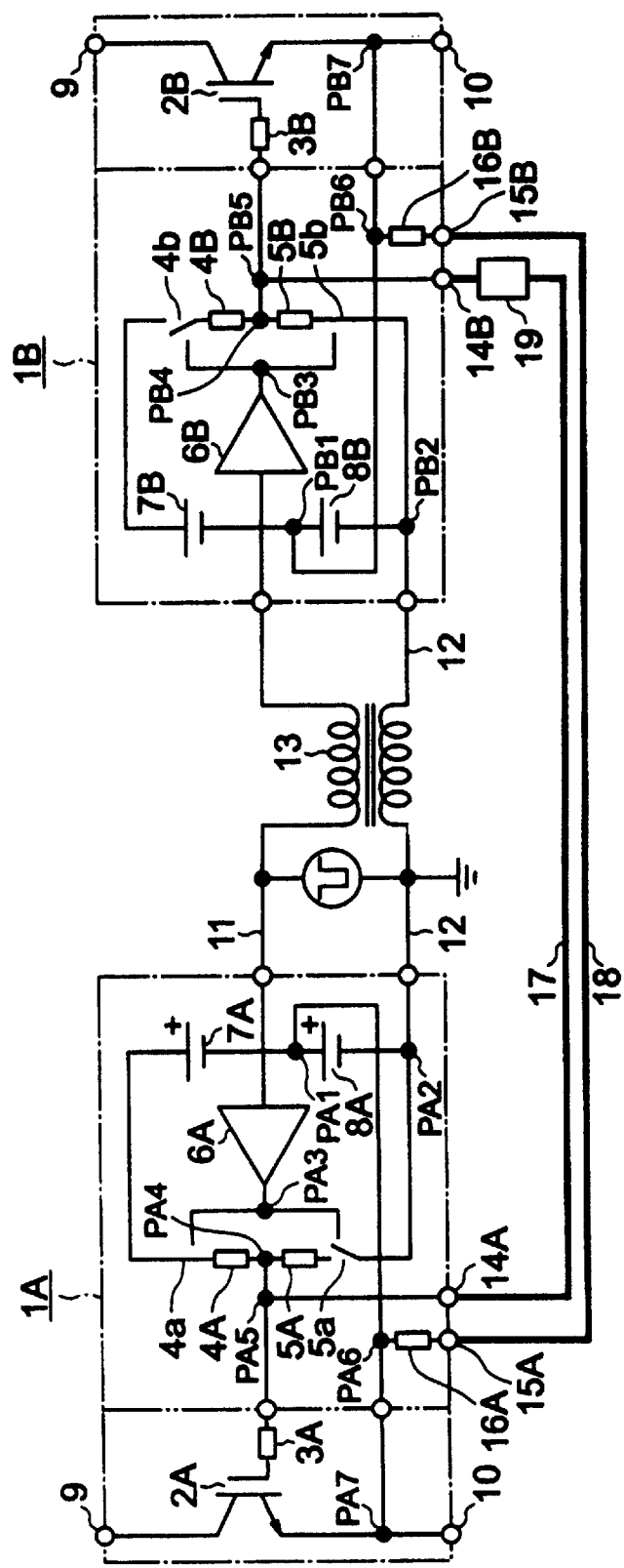
FIG. 2 is a block diagram of each of IPMs in the power semiconductor device shown in FIG. 1, which describes a time difference to arise between their drive circuits.

As a result, usually, the switching elements 4a and 4b are turned off and the switching elements 5a and 5b are turned on. However, because there is an operation time difference between the switching elements of the gate elements 6A and 6B, as well as among the switching elements 4a, 5a, 4b, and 5b in the drive circuit in each of the IPM1A and the IPM1B, for example, the IPM1A switching element 4a in the drive circuit whose operation is slower is kept on as shown in FIG. 2.

The IPM1B switching element 4b, for example, in the faster drive circuit is turned off and the switching element 5b is turned on.

When the IPM1A is instructed so as to be turned on, thereby the switching element 4a is turned on and the switching element 5a is turned off and the IPM1B is instructed so as to be turned off, thereby the switching element 4b is turned off and the switching element 5b is turned on as described above, the turn-on side resistor 4A and the turn-off side resistor 5B having the same resistance value as that of the resistor 4A come to be connected serially to the serially connected circuits of the turn-on side first power supply 7A and the turn-off side second power supply 8B. As a result, the serial synthesized voltage obtained from the first and second power supplies 7A and 8B is divided equally by the resistors 4A and 5B. Each divided voltage is applied equally to each gate of the IGBT2A and the IGBT2B from the junction points PA5 and PB5 between the resistors 4A and 5B. Consequently, even when the operation speed is varied between the drive circuits incorporated in the IPM1A and the IPM1B, the gates in the IGBT2A and the IGBT2B are kept at the same potential. Therefore, no unbalanced state occurs between the operation times of the IGBT2A and the IGBT12B.

The emitter auxiliary terminals 15A and 15B are connected to the I/O common line of the IGBT2A and the IGBT2B via the resistors 16A and 16B having 1 to 2 ohms respectively. Otherwise, because the emitters of the IGBT2A and the IGBT2B are connected to each other in the IPM1A and the IPM1B via the emitter main circuit line EC, the emitters are kept almost at the same potential.

After this, the IPM1A side drive circuit whose operation is slower is activated, thereby the potentials of the gates of the IGBT2A and the IGBT2B become minus (−) in the IPM1A and the IPM1B connected to each other in parallel when a minus (−) potential is applied to the IGBT2A gate. The switching elements are thus turned off at the same time.

The above operations are done in the reverse order when the switching elements are turned on at the same time regardless of the variation of the operation speed of each IPM drive circuit connected to another in parallel. The variation of the operation speed of the drive circuit is eliminated such way and the gates and the emitters of the IGBT in each IPM connected to another in parallel are kept at the same potential during a turn-on or turn-off operation regardless of the variation of the operation speed of the drive circuit incorporated in each IPM, a uniform current can be applied to the modules connected to each other in parallel.

Figure 3:
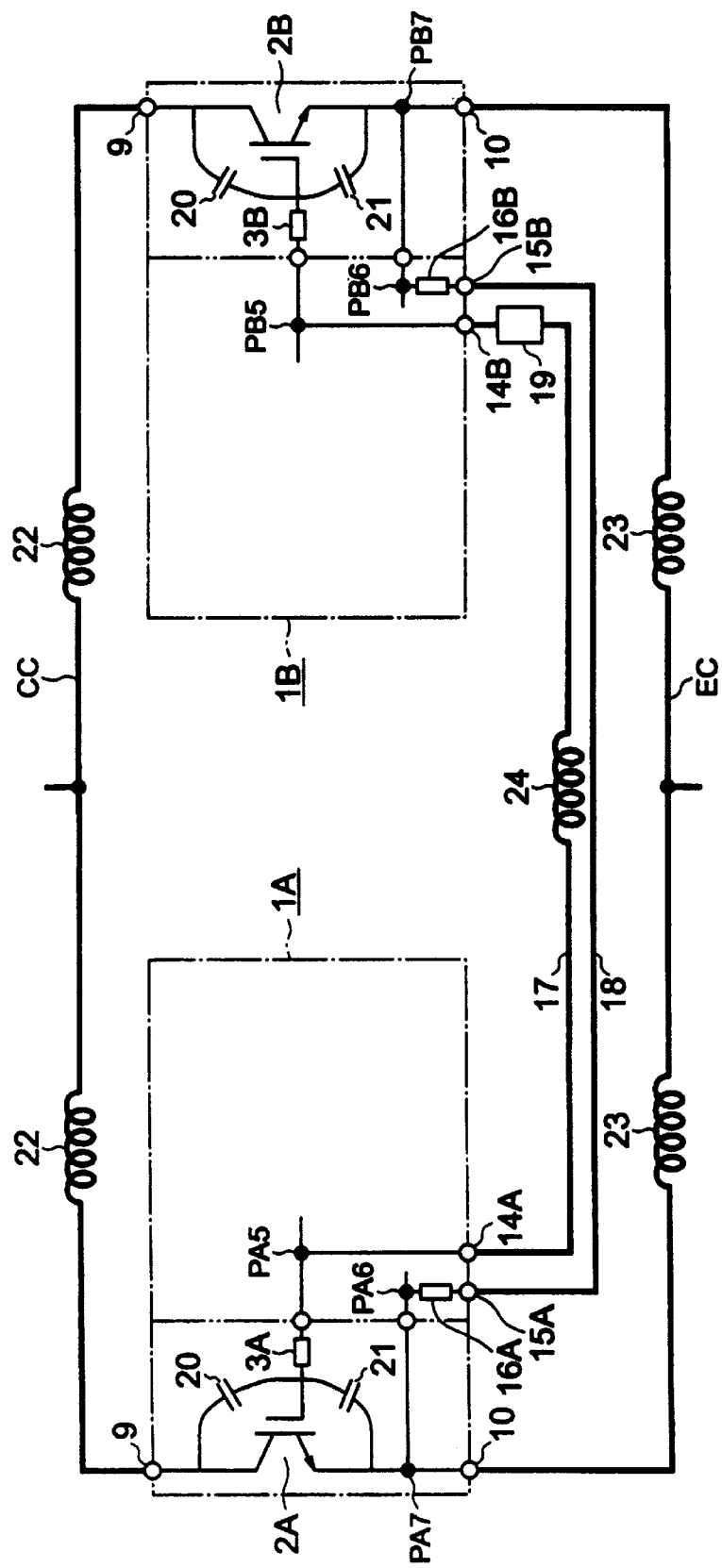
FIG. 3 is a block diagram of a resonance circuit formed with a connection line of an IGBT gate auxiliary terminal of an IPM in the first embodiment of the present invention.

However, when the gate auxiliary terminals 14A and 14B are connected to each other, a loop is formed by the gate auxiliary terminal connection line 17 and the collector side main circuit line CC via each gate-collector capacity 20 as shown in FIG. 3. And, the inductance members 22 and 24 of the collector side main circuit line CC and the gate auxiliary terminal connection line 17 are added to this loop, thereby a resonance loop is formed.

In another case, a loop is formed by the gate auxiliary terminal connection line 17 and the emitter side main circuit line EC via the gate-emitter capacity 21 and the inductance members of the gate auxiliary terminal connection line 17 and the emitter side main circuit line EC are added to this loop, thereby a resonance loop is formed. As a result, those resonance loops cause a resonance to occur. This has been a problem.

In this embodiment, however, the inductance 24 of the gate auxiliary terminal connection line 17 is reduced effectively so as to suppress this resonance. And, in order to reduce the inductance 24, the gate auxiliary terminal connection line 17 that connects the gate auxiliary terminals 14A and 14B between the IPM1A and the IPM1B and the gate auxiliary terminal connection line 18 that connects the emitter auxiliary terminals 15A and 15B between the IPM1A and the IPM1B are connected to each other via a pair of leads.

There are three methods for realizing the above connections as shown below.

(1) Parallel plate conductors are used.

(2) Twisted pair cables are used.

(3) Coaxial cables are used.

Any of those three methods can reduce the inductance of a line and the optimal method can be selected from them according to the device configuration, as well as the cost and the easiness of the assembling work.

Furthermore, it is also effective to suppress occurrence of a resonance to connect the gate auxiliary terminals 14A and 14B to each other by the gate auxiliary terminal connection line 17 via a ferrite beads core 19 having a high impedance in the resonance frequency range (over several MHz).

As described above, because an inductance reduction line is used for both of the gate auxiliary terminal connection line 17 and the emitter auxiliary terminal connection line 18 and a ferrite beads core 19 is inserted into the gate auxiliary terminal connection line 17, the resonance caused by the resonance loop formed via the gate auxiliary terminal connection line 17 can be suppressed completely.

When an emitter loop is formed between the emitter auxiliary terminal connection line 18 and the emitter side main circuit, an unbalanced current is applied to the emitter loop due to the switching time flux linkage or the current unbalance to occur between the IPM1A and the IPM1B connected in parallel. And, this unbalanced current might cause the drive circuit to malfunction.

Figure 6:
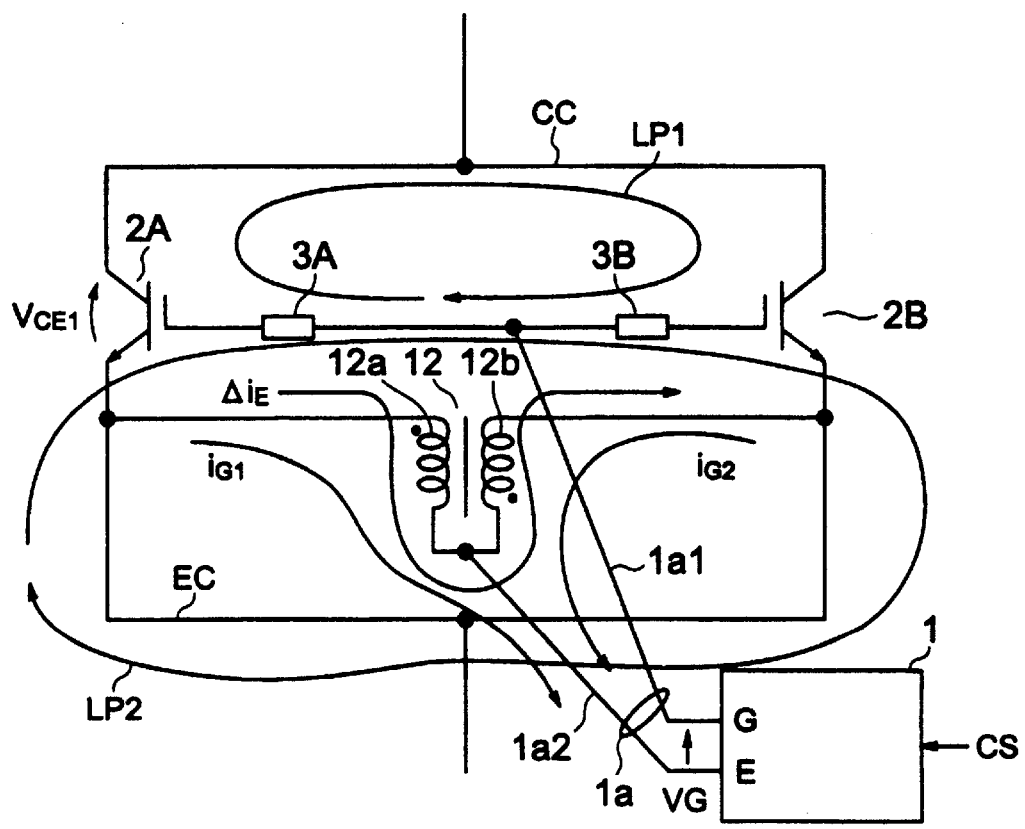
FIG. 6 is a circuit diagram in which a plurality of conventional semiconductor modules are connected to each other in parallel.

In order to prevent this, the current of this emitter loop must be reduced as much as possible. Japanese Patent Laid-Open No.10-14215 discloses a technique for suppressing an increase of such the current by inserting an inductance between emitter auxiliary terminals (see FIG. 6). In this first embodiment, however, an emitter auxiliary terminal connection line is used so as to reduce the inductance between gate auxiliary terminal connection lines. Therefore, it will not be a proper method to insert an inductance between those connection lines.

In this first embodiment, therefore, resistors 16A and 16B are inserted in the emitter loop so as to reduce the current. When the resistance values of those resistors 16A and 16B are large, however, a significant difference occurs between emitter potentials of the IGBT2A and the IGBT2B connected in parallel depending on the value of the flowing current. The resistance value should therefore be limited to 1 to 2 ohms.

As apparent from the above description, according to this first embodiment, the IPM1A and the IPM1B can be connected to each other in parallel easily just like the parallel connection of semiconductor modules that incorporate neither a drive circuit nor a protection circuit therein. In addition, because the labor for selecting elements is reduced significantly for parallel connection of the IPM1A and the IPM1B, it is possible to provide a device in which IPMs are connected to each other in parallel by making the most of only the advantage of the IPM such as protecting function, etc.

Second Embodiment

Figure 4:
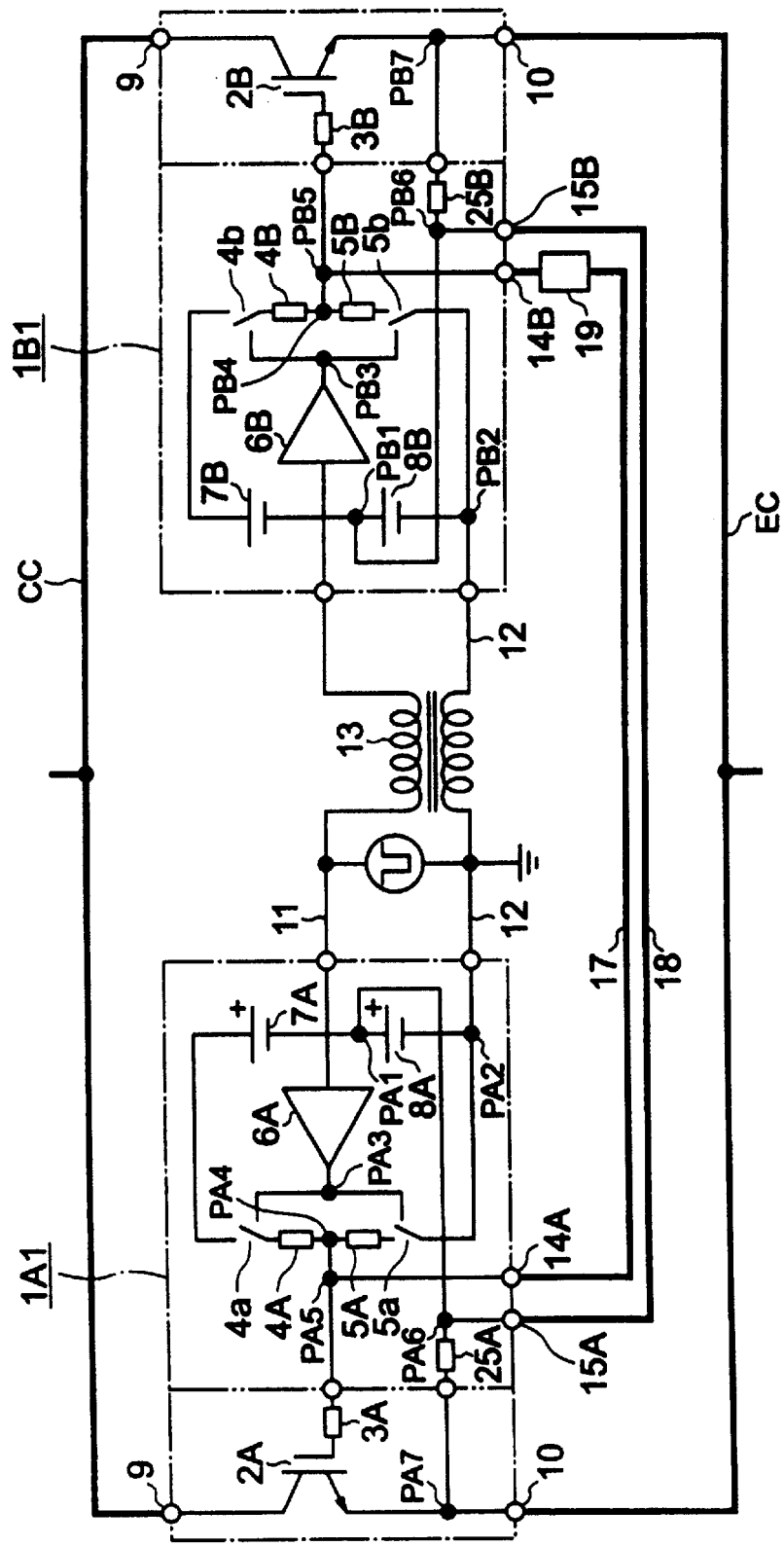
FIG. 4 is a block diagram of a power semiconductor device according to a second embodiment of the present invention.
Figure 5:
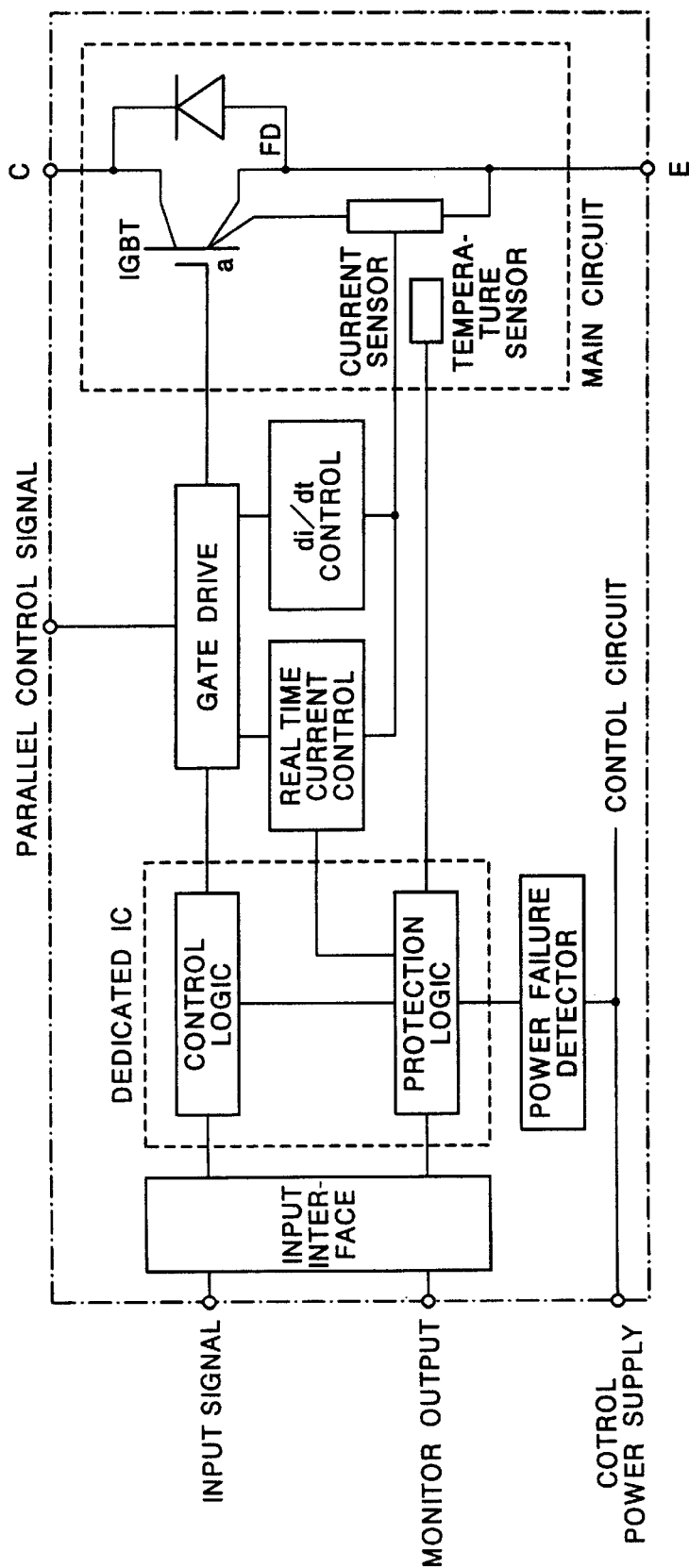
FIG. 5 is a block diagram of a conventional IPM.

FIG. 4 is a block diagram of a power semiconductor device in a second embodiment of the present invention.

In FIG. 4, the same reference symbols are given to the same items as those shown in FIG. 1.

As described above, in the above first embodiment, a resistor 16A(16B) is connected to between the junction point PA6(PB6) formed on the I/O common line that connects the serial junction point between the first power supply 7A(7B) and the second power supply 8A(8B) to an emitter and the emitter auxiliary terminal 15A(15B) so that the emitter of the IGBT2A(2B) and the emitter auxiliary terminal connection line 18 are connected to each other via this resistor 16A(16B).

In this second embodiment, however, the junction point PA6(PB6) and the emitter auxiliary terminal 15A(15B) are connected to each other via a circuit pattern and a resistor 25A(25B) is inserted serially in the I/O common line so that the emitter of the IGBT2A(2B) and the serial junction point between the first power supply 7A(7B) and the second power supply 8A(8B) are connected to each other via this resistor 25A(25B).

As a result, it is possible to reduce the current flowing in the emitter loop as much as possible just like in the first embodiment.

INDUSTRIAL APPLICABILITY

The present invention can ease the criterion for selecting switching elements according to the switching characteristics of those switching elements employed for intelligent power modules to be connected to each other in parallel and has a uniform current flown in each intelligent power module connected to each other in parallel.

What is claimed is:

1. A power semiconductor device, comprising:

a first semiconductor switching circuit configured by semiconductor switching elements;

a second semiconductor switching circuit configured by said semiconductor switching elements, said second semiconductor switching circuit being connected in parallel with said first semiconductor switching circuit;

first main electrodes connected at main current input sides of said semiconductor switching elements;

second main electrodes connected at main current out put sides of said semiconductor switching elements;

a plurality of resistor having the same resistance value, connected to each of said second main electrodes;

a first line conductor for connecting each of said second main electrodes to said resistor via an auxiliary terminal; and a second line conductor for connecting a control electrode of each of said semiconductor switching elements via an impedance element having a high impedance at a predetermined frequency.

2. The power semiconductor device according to claim 1, characterized in that each of said first and second semiconductor switching circuits is an intelligent power module in which a semiconductor switching element, a driver of this switching element, and a protection circuit are united into one.

3. The power semiconductor device according to claim 1, characterized in that said first line conductor and said second line conductor are laid closely to each other.

4. The power semiconductor device according to claim 3, characterized in that said first line conductor and said second line conductor are configured by plate conductors disposed in parallel.

5. The power semiconductor device according to claim 3, characterized in that said first line conductor and said second line conductor are configured by twisted pair lines formed by twisting a plurality of leads respectively.

6. The power semiconductor device according to claim 3, characterized in that said first line conductor and said second line conductor are configured by shielded lines formed by sheathing a plurality of leads in a shielding member respectively.

* * * * *